(12) United States Patent
Ren et al.

(10) Patent No.: US 7,635,990 B1
(45) Date of Patent: Dec. 22, 2009

(54) METHODS AND APPARATUS FOR IMPLEMENTING AN OUTPUT CIRCUIT

(75) Inventors: Guo Jun Ren, San Jose, CA (US); Qi Zhang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/175,925

(22) Filed: Jul. 18, 2008

(51) Int. Cl.
*H03K 19/094* (2006.01)
*H03K 19/0175* (2006.01)

(52) U.S. Cl. .............................. 326/86; 326/30; 326/33
(58) Field of Classification Search ................ None
See application file for complete search history.

(56) References Cited

U.S. PATENT DOCUMENTS

| | | | |
|---|---|---|---|
| 6,504,397 B1 | 1/2003 | Hart et al. | |
| 6,774,666 B1 | 8/2004 | Samad | |
| 6,806,728 B2 * | 10/2004 | Nguyen et al. | 326/30 |
| 7,030,656 B2 * | 4/2006 | Lo et al. | 326/86 |
| 7,071,739 B1 * | 7/2006 | Duzevik et al. | 327/108 |
| 7,236,004 B1 | 6/2007 | Zhou et al. | |
| 7,348,810 B1 * | 3/2008 | Nair | 327/108 |

* cited by examiner

*Primary Examiner*—Anh Q Tran
(74) *Attorney, Agent, or Firm*—Lois D. Cartier

(57) ABSTRACT

An output circuit providing an adjustable output amplitude and common-mode voltage is described. The output circuit includes at least one driver circuit and a common-mode feedback circuit including a first replica circuit of the at least one driver circuit. The common-mode feedback circuit is coupled to receive a first bias and provide an output coupled to the at least one driver circuit. The output circuit may also include a current circuit having a configurable resistor and a second replica circuit of the at least one driver circuit. The current circuit may be coupled to receive a second bias and to provide an output coupled to the at least one driver circuit and the common-mode feedback circuit.

14 Claims, 6 Drawing Sheets

METHODS AND APPARATUS FOR IMPLEMENTING AN OUTPUT CIRCUIT

FIELD OF THE INVENTION

The invention generally relates to integrated circuit devices (ICs). More particularly, the invention relates to an output circuit of an integrated circuit.

BACKGROUND

An output circuit is a well known type of circuit that is implemented in an integrated circuit for providing an output signal. Advanced integrated circuits may include a plurality of output circuits providing different types of signaling, such as single-ended or differential signaling. Differential signaling is a method of transmitting electrical signals by means of two complementary signals sent on two separate wires such as traces of a printed circuit board (PCB). Differential signals are typically coupled in differential pairs usually found on a PCB, in cables (twisted-pair cables, ribbon cables), and in connectors. Differential pairs are usually used to couple high speed signals (e.g., digital serial interface signals) or high frequency analog signals (e.g., video signals). Advantages of utilizing differential signaling may include tolerance to ground bounce or offsets, low-voltage signaling, minimized cross-talk, and increased resistance to electromagnetic interference. The complementary or differential signals described above are usually referenced to a ground potential or common-mode voltage ($V_{cm}$).

As noted above, examples of output circuits may include differential driver circuits providing complementary signals referenced to a common-mode voltage. The $V_{cm}$ is a voltage having a positive or a negative value with reference to a ground potential, depending on the signaling design protocol. For example, Low-voltage differential signaling (LVDS) is a differential signaling system that can run at very high speeds over conductive wires or traces of a PCB. The LVDS standard, for example, may support differential output signals having voltage amplitude in the range of 250-450 mV and a voltage offset or $V_{cm}$ in the range of 1.125-1.375 V.

There are other differential signaling protocols, for example, current-mode logic (CML), low-voltage positive/pseudo emitter-coupled logic (LVPECL). In general, integrated circuits may include various types of output circuits. The various output circuits may provide interfaces to support single ended signaling and/or differential signaling.

SUMMARY

An embodiment of the present invention may provide an output circuit including at least one driver circuit, a common-mode feedback circuit including a first replica circuit of the least one driver circuit coupled to receive a first bias and provide an output coupled to the least one driver circuit, and a current circuit including a configurable resistor and a second replica circuit of the at least one driver circuit coupled to receive a second bias and provide an output coupled to the least one driver circuit and the common-mode feedback circuit.

Another embodiment of the present invention may also provide a method of providing controllable output amplitude and common-mode voltage for an output interface. The method include the steps of providing a driver module, implementing a common-mode feedback module including a first replica of the provided driver module, implementing a current module including a second replica of the driver module, coupling an output of the current module and an output of the common-mode feedback module to the driver module, applying a bias voltage to the current module and the common-mode feedback module, and adjusting a plurality of impedances of the current module and the common-mode feedback module.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

Figure 1:
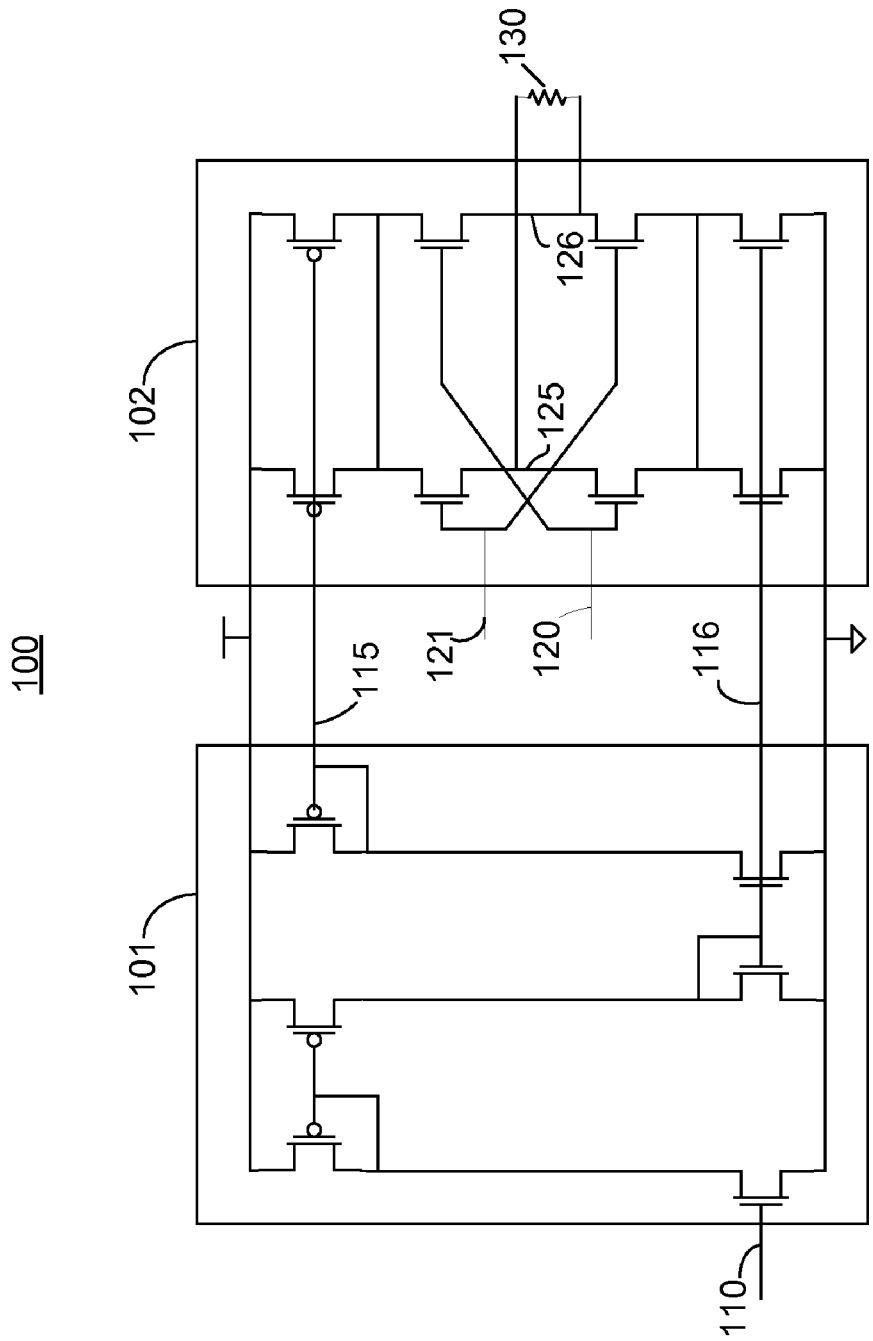
FIG. 1 schematically illustrates an output circuit including a bias generator and a driver circuit.

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention. For instance, in the present specification, the same reference characters are used to refer to terminals, signal lines, and their corresponding signals.

In general, different signaling protocols may require different $V_{cm}$ and output amplitude. Most advanced integrated circuits are implemented to support one or more output interface protocols. Therefore, it would be beneficial for an integrated circuit to include a line driver or an output circuit supporting a plurality of signaling protocols. Additionally, it is desirable for an integrated circuit to provide an output circuit that is capable of independently controlling the output amplitude and the $V_{cm}$ levels. One or more aspects of this invention describe an output circuit capable of providing controllable output amplitude and controllable $V_{cm}$ independent of one another. Additionally, the output circuit may be insensitive to process, supply voltage, and temperature variations.

FIG. 1 schematically illustrates an output circuit including a bias generator circuit and a driver circuit. Circuit 100 may represent an implementation of an output circuit including the bias generator circuit 101 and the driver circuit 102. Circuit 100, for example, is capable of driving a differential load (e.g., impedance 130); therefore, driver circuit 102 is a differential driver. In general, differential signaling is a method of transmitting information by means of two complementary signals. In FIG. 1, for example, the driver circuit 102 is capable of providing differential signals across the impedance 130 via signals 125 and 126.

The bias generator circuit 101 may be coupled to provide bias voltages to circuit 102. For instance, signals 115 and 116 may provide bias voltages to PMOS transistors and NMOS transistors of circuit 102 respectively. In an example, signal 115 may be referred to as the pbias signal, while signal 116 may be referred to as the nbias signal. Bias voltages coupled to signals 115 and 116 may configure circuit 102 to provide outputs having the desired amplitude and/or $V_{cm}$ across the impedance 130. In general, signals 125 and 126 (outputs of circuit 102) are responsive to values coupled signals 120 and 121, where signals 120 and 121 are complementary data inputs to the driver circuit 102.

Circuit 100 may provide a fixed output amplitude and $V_{cm}$ (coupled to signals 125 and 126) based on the nbias and pbias signals (e.g., signals 116 and 115 respectively). Circuit 100 may exhibit output variations (e.g., output amplitude and $V_{cm}$ variations) in response to process, supply voltage, and temperature variations. For instance, circuits 101 and 102 may provide a range of outputs in response to process variations. As shown in FIG. 1, circuits 101 and 102 include a plurality of NMOS and PMOS transistors each having predetermined length and width based on an implemented design. During the fabrication process, shift in process parameters, such as length and width, may change the performance of PMOS and NMOS transistors. Additionally, mismatches in transistors may have adverse effects, such as rendering the circuit inoperable. Mismatch in transistors of circuit 101, for example, may change bias voltages coupled to signals 115 and 116 from nominal expected values. Therefore, circuit 102 may fail to provide the correct outputs (e.g., via signals 125 and 126) in response to altered values of signals 115 and 116. In another example, circuit 102 may provide an incorrect amplitude and/or $V_{cm}$ in response to altered values of signals 115 and 116 due to process shift.

Variations in the other two parameters, e.g., supply voltage and temperature, may also exert unfavorable effects on circuit 100 similar to those of process variation. For example, supply voltage variation may shift bias points of the NMOS and PMOS transistors in circuits 101 and 102 to where the transistors may operate outside their nominal design settings. Additionally, supply voltage variation may affect the value coupled to signal 110. For instance, the values of signals 115 and 116 are based on the value coupled to signal 110.

Another important performance parameter of a circuit, such as circuit 101, is temperature. In general, variation in temperature may affect the operation of a circuit design due to the temperature coefficient of transistors utilized in the circuit design. The temperature effects on the circuit design may include degradation in performance, and in some instances the circuit design may fail to operate properly. For instance, circuit 101 may generate voltages or currents outside the nominal operating range due to temperature; subsequently circuit 102 may generate outputs (e.g., 125 and 126) outside the nominal range as well. Therefore, the need exists for an output circuit tolerant to process, supply voltage, and temperature variations.

Figure 2:
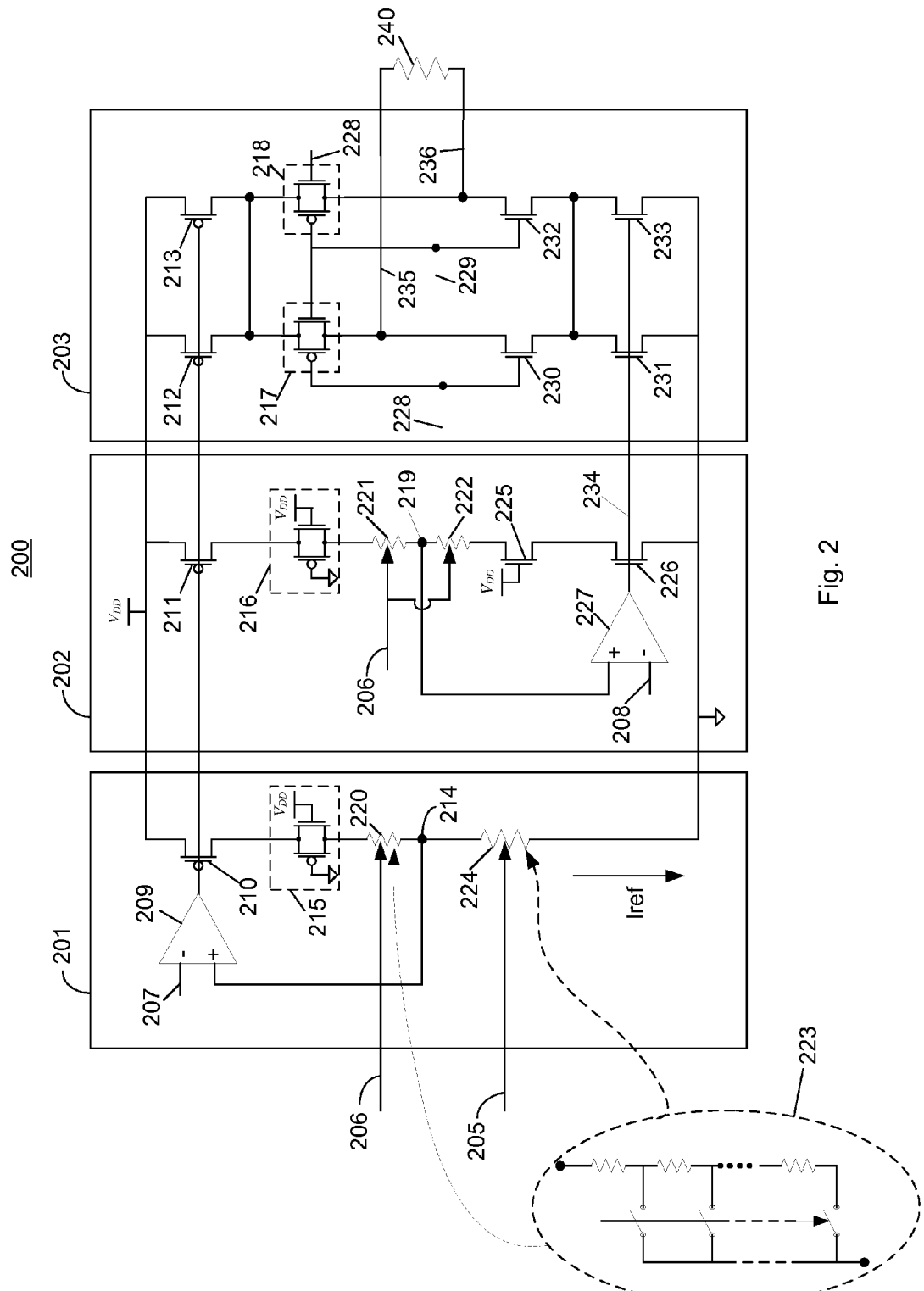
FIG. 2 schematically illustrates an output circuit according to an embodiment of the present invention.

FIG. 2 schematically illustrates an output circuit according to an embodiment of the present invention. Circuit 200 includes a driver circuit 203, a common-mode feedback circuit 202, and a current circuit 201. The driver circuit 203, for example, includes a plurality of NMOS and PMOS transistors coupled together to provide a differential output represented by signals 235 and 236. Circuit 203 may include two identical branches for providing the output (e.g., signal 235) and the complement of the output (e.g., signal 236), where signals 235 and 236 are the outputs of circuit 200. According to an embodiment of the present invention, circuit 200 is capable of providing a differential output compliant with a plurality of output protocols, e.g., the LVDS standard, or a user-defined output. Circuit 200 may be configured to provide an output having controllable amplitude and $V_{cm}$. Also, circuit 200 may provide an output insensitive to parameters, such as process, supply voltage, and temperature, as will be described in more detail below.

For instance, the performance of circuit 200 over the parameters described above is partially based on a first replica circuit implemented in the common-mode feedback circuit 202 and a second replica circuit implemented in the current circuit 201. The term "replica circuit" is used herein to refer to a copy of all or part of an original circuit. Transistors in the original circuit may be duplicated in the replica circuit, and may have the same transistor sizes or different transistor sizes. However, the structure of the replica circuit is the same as that of the original circuit, although additional circuit elements (e.g., transistors, resistors, and so forth) may be included in the replica circuit. The first replica circuit and the second replica circuit, for example, each may be a copy of a portion of the driver circuit 203. Two circuits are said to be "similar to" or "copies of" each other herein if they have the same structure, although transistor sizes and orientations may be different. Furthermore, the first replica circuit may include a copy of the second replica circuit. The first replica circuit may be similar to a branch or a slice of the driver circuit 203, as will be described in more detail below. Other features, such as termination impedance matching, may be incorporated in circuits 202 and 201, where such features may enable circuit 200 to deliver improved performance over the parameters described above. FIG. 2, for instance, illustrates separate blocks (e.g., blocks 201, 202, and 203). The different blocks may be overlapped or combined in a design performing the same function, as described below with reference to circuit 200.

The common-mode feedback circuit 202 and the current circuit 201 may include controllable elements. For instance, the current circuit 201 may include controllable or adjustable elements 220 and 224. Element 224, for example, may be an adjustable resistor controlled by signal 205. It should be appreciated that adjustable resistors may be implemented by numerous means. For example, an adjustable resistor may be a multi segment poly-silicon resistor 223. FIG. 2, for instance, shows a multi segment resistor network coupled together with switches (e.g., circuit 223), where a control signal, e.g., signal 205, controls the switches, thereby, adjusting the resistance value of the resistor network. Other methods of implementing an adjustable resistor are well known to persons skilled in the art, for example, a MOS transistor biased to fashion a resistor. Controlling the bias of such an MOS transistor may provide the adjustable resistor having a value based on the bias.

The current circuit 201 may provide a reference current, e.g., Iref, coupled with circuits 202 and 203. The current Iref may be programmable or controlled by two parameters. The two parameters can be, for instance, a voltage bias coupled to a negative node of an operational amplifier (OpAmp) 209 (e.g., signal 207), and an adjustable current resistor 224 (e.g., controlled by signal 205 as described above). In general, OpAmp 209 may be used to maintain a constant voltage at node 214. For instance, the voltage difference between a negative input and a positive input of an OpAmp is about zero volts (0V), while the voltage value of node 214 may equal the voltage value coupled to signal 207. The current Iref may have a value represented by the following equation: Iref=voltage at node 214/value of resistor 224. A further simplification to resolve the value of Iref current may be stated as: Iref=V(of signal 207)/R(of resistor 224). As shown in FIG. 2 the value of resistor 224 may be adjusted by signal 205 and the voltage of signal 207 is provided, therefore, the Iref current may be defined based on a user implemented design.

The Iref current may be mirrored, e.g., copied with a predetermined ratio, by the circuit 202 via PMOS transistor 211, and by the circuit 203 via transistors 212 and 213. In an example, the PMOS transistors 212 and 213 may be identical, e.g., having identical width and length measurements, while PMOS transistors 210 and 211 may have different widths and/or lengths from PMOS transistors 212 and 213. For example, transistors 210 and 211 may be related to PMOS transistors 212 and 213 by a predetermined ratio based on a current requirement. For instance, if circuit 202 requires two times (2×) the Iref current of circuit 201, PMOS transistor 211 may have 2× the width of PMOS transistor 210. In general, to ratio transistors of a design, the lengths of such transistors may be kept fixed while the widths are proportioned according to the design specification. In other instances, any number of different transistor ratios may be used to achieve a design objective. In general, implementing a circuit including transistors having integer multiple ratio relationship may minimize fabrication/processing errors due to mismatch.

According to an example of the present invention, the current circuit 201 and the common-mode feedback circuit 202 each may include a replica circuit of the driver circuit 203. The replica circuit included in circuit 201 may minimize variations, e.g., current and/or voltage mismatch, in circuit 200 over process, supply voltage, and temperature. For instance, the replica circuit implemented in circuit 201 may include PMOS transistor 210 having a source coupled to a supply voltage (Vdd), a gate coupled to a bias voltage, e.g., the output of the OpAmp 209, and a drain coupled to a first node of a pass gate 215. A second node of the pass gate 215 is coupled to a first node of an adjustable resistor 220, a second node of the resistor 220 is coupled to termination adjust signal 206, and a third node of the resistor 220 is coupled to the positive input of the OpAmp 209.

OpAmp 209, for example, is implemented to provide an output that may bias PMOS transistors 210-213. In some instances, the bias voltage generated by the OpAmp 209 is referred to as the pbias signal, since it biases the PMOS transistors of circuits 202 and 203. In another example, the pass gate 215 includes PMOS and NMOS transistors biased to be conductive. Adjustable resistor 220 may be configured to have a value equivalent to three times (3×) the value of the termination impedance 240. For instance, if circuit 200 is configured to meet the LVDS protocol, resistor 220 may be configured to have a value of 300 Ohms. In general, the LVDS termination resistor may be 50 Ohms when single-ended, or 100 Ohms when differential. In another example, if the termination load is coupled to circuit 200 in single-ended format, e.g., 50 Ohms referenced to a ground potential, then the value of resistor 220 may be configured to be 6× the value of the single ended termination impedance.

As mentioned above, circuit 200 may include the common-mode feedback circuit 202, where circuit 202 may provide a bias responsive to the reference current Iref and a bias voltage of signal 208. Circuit 202 may provide an output, e.g., signal 234, coupled to circuit 203. For example, the output of circuit 200, e.g., signals 235 and 236, may have $V_{cm}$ responsive to the bias (e.g., signal 234) provided by circuit 202. Signal 234, for instance, may be referred to as the nbias signal, since it biases NMOS transistors of circuit 203 (e.g., gates of transistors 231 and 233). In an example of the present invention, circuit 202 may include a replica circuit, where the original circuit may be a branch of the driver circuit 203. For example, circuit 202 includes a replica circuit that includes PMOS transistor 211, pass gate 216, and NMOS transistors 225 and 226, which may be similar in structure to an original circuit that includes PMOS transistor 212, pass gate 217, and NMOS transistors 230 and 231 of the output driver circuit 203.

The replica circuit of circuit 202, for instance, includes PMOS transistor 211 having a source coupled to Vdd, a gate coupled to the output of the OpAmp 209 of circuit 201, and a drain coupled to a first node of a pass gate 216. A second node of the pass gate 216 may be coupled to a first node of an adjustable resistor 221, and a second node of the adjustable resistor 221 may be coupled to the positive input of the OpAmp 227. The second node of resistor 221 is coupled to a first node of resistor 222. The control signal 206, for instance, may configure resistors 221 and 222 to have equal values. In circuit 200, for example, the PMOS transistor 211 and the pass gate 216 of circuit 202 may be identical to the PMOS transistor 210 and the pass gate 215 of circuit 201. In another example, PMOS transistor 211 and pass gates 216 may be related to PMOS transistor 210 and pass gates 215 by a predetermined ratio proportional to the current values used by the circuits 202 and 201 respectively. For instance, if circuit 202 requires 2× (twice) the current of circuit 201, then the sizes of the PMOS transistor 211 and/or the pass gate 216 may be 2× the sizes of the PMOS transistor 210 and the pass gate 215.

Controllable resistors or termination resistors 220-222 may have the same relationship with the termination resistor 240, e.g., resistors 220-222 each may be configured to have a value 6× the value of the termination resistor 240. The resistors 220-222 may be fabricated using the poly-silicon layer of the integrated circuit. In some instances, values of the resistors 220-222 may have small variations due to mismatches in the poly-silicon sheet resistance and/or mismatches via contact resistance in contacts used in implementing the resistors. In general, the differences between the resistors are negligible and may not affect the overall performance of the circuit 200 over process, supply voltage, and temperature.

A second node of resistor 222 is coupled to a drain node of NMOS transistor 225, a gate node of transistor 225 is coupled to Vdd, and a source node is coupled to a drain node of NMOS transistor 226. The gate node of NMOS transistor 226 may be coupled to an output of OpAmp 227, and source of transistor 226 is coupled to a ground potential. A negative input of the OpAmp 227 may be coupled to receive a bias voltage via signal 208, where the bias voltage of signal 208 may configure the $V_{cm}$ of the signals 235 and 236, the output of circuit 200.

The OpAmp 227 may provide a bias voltage to NMOS transistors 226, 231, and 233. Furthermore, OpAmp 227 may set the bias voltage of node 219, e.g., the bias voltage of 219 may equal the bias voltage coupled to signal 208. OpAmp 227 may be configured to maintain the bias voltage of node 219 over a range of parameters, e.g., supply voltage, and temperature. In an example of the present invention, the bias voltages of signals 207 and 208, of circuits 201 and 202 respectively, may be provided by a bandgap circuit (not shown for simplicity). In general, a bandgap circuit provides a bias voltage insensitive to parameters variations, such as temperature and supply voltage variations. Therefore, nodes 214 and 219 may have bias voltages that are insensitive to temperature and supply voltage variations. The Iref current may also be insensitive to temperature and supply voltage variations since it is based on the bias voltage of node 214 and the resistance value of resistor 224. Circuit 200 may provide an output, e.g., signals 235 and 236, insensitive to supply voltage and temperature, for the same reasons, e.g., the output of circuit 200 is based on the Iref, pbias, and nbias signals provided by circuits 201 and 202 respectively.

According to another embodiment of the present invention, the first replica circuit and the second replica circuit (e.g., of circuits 202 and 201, respectively) may minimize effects due to process variations. In general, a circuit design that includes identical transistors and/or transistors that are integer multiples of one another is less adversely affected by process variations. Such transistors may have fewer mismatches between them even if the process has shifted. For example, the transistors used in the first replica circuit and the second replica circuit may be similar to transistors used in the driver circuit 203. In other instances, the structure may remain identical between transistors of circuit 203 and transistors used in circuits 201 and 202, but transistor sizes may differ. For example, transistors used in the first replica circuit and the second replica circuit may be integer multiple of transistors of the driver circuit 203. In an example of the present invention, transistors 212 and 213 may be 4× the size of transistor 211 of circuit 202, and 8× the size of transistor 210 of circuit 201. The gates of the transistors mentioned above may be aligned in the same direction to minimize mismatch.

Figure 3:
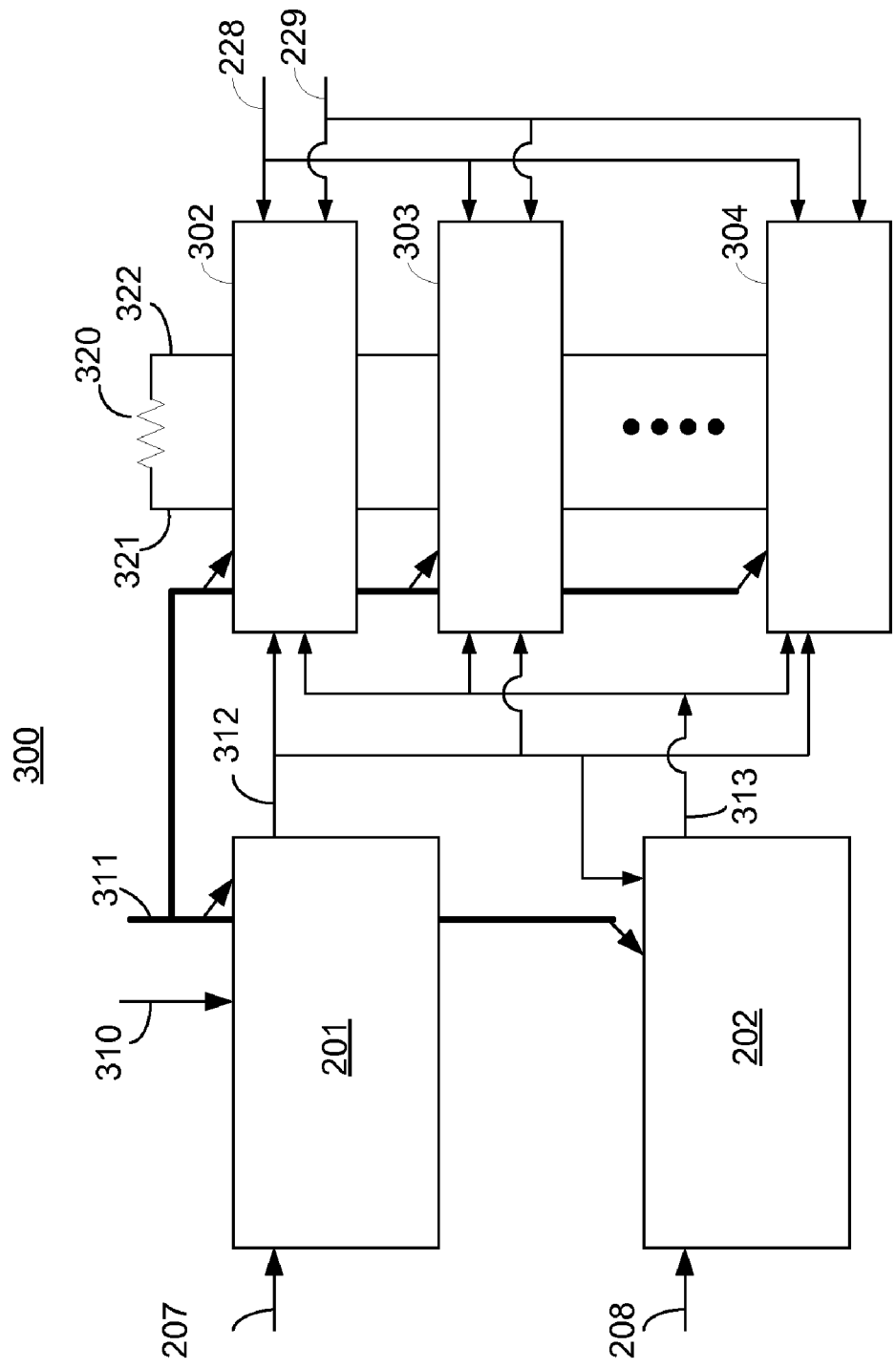
FIG. 3 illustrates a block diagram of an output circuit according to an embodiment of the present invention.

Turning to FIG. 3, block diagram 300 illustrates an output circuit according to an embodiment of the present invention. The circuit of FIG. 3 may include the common-mode feedback circuit 202 and the current circuit 201 of circuit 200, and driver circuits 302-304. The driver circuits 302-304 may be identical output drivers, e.g., multiple instantiations of driver circuit 203, selectively coupled to one another in parallel. For instance, selectively coupling the plurality of driver circuits 302-304 may provide an output having amplitude proportional to the number of driver circuits coupled together. For instance, if each driver circuit of the driver circuits 302-304 provides 200 mV of output amplitude, then with three driver circuits selectively coupled together, 600 mV may be measured across termination impedance 320.

As shown in FIG. 3, the current circuit 201 and common-mode feedback circuit 202 may be coupled to receive bias voltages via signals 207 and 208 respectively. Circuit 201 of FIG. 3 may be further coupled to receive control signals 310 and 311, where signal 310 may configure the Iref current value and signal 311 may configure output drive and impedance matching. Control signal 310 may configure the adjustable resistor of circuit 201, e.g., resistor 224, to properly set the Iref current to operate circuit 300. For instance, when a design implantation requires a greater current to operate circuit 300, circuit 201 of FIG. 3 may be configured to have a higher bias voltage coupled to signal 207 and/or resistor 224 may be configured to have a smaller value via signal 310.

Control signal 311, as described above, may configure the output drive and impedances of circuits 201 and 202. For instance, configuring the output drive may include selectively coupling the plurality of driver circuits 302-304, and adjusting resistors to compensate for the termination impedance coupled to circuits 302-304. Signal 311 may configure the adjustable termination resistors of circuits 201 and 202 of FIG. 3, e.g., controllable termination resistors 220-222. For example, each of the resistors 220-222 of circuit 300 may be configured to have a value related to the load impedance 320 as described above with reference to circuit 200. Configuring the adjustable termination resistors 220-222 of circuit 300, for instance, may minimize mismatch between circuits 201, 202, and 302-304, and thereby may minimize variations of the output amplitude and/or $V_{cm}$ over supply voltage and temperature variations.

Figure 4:
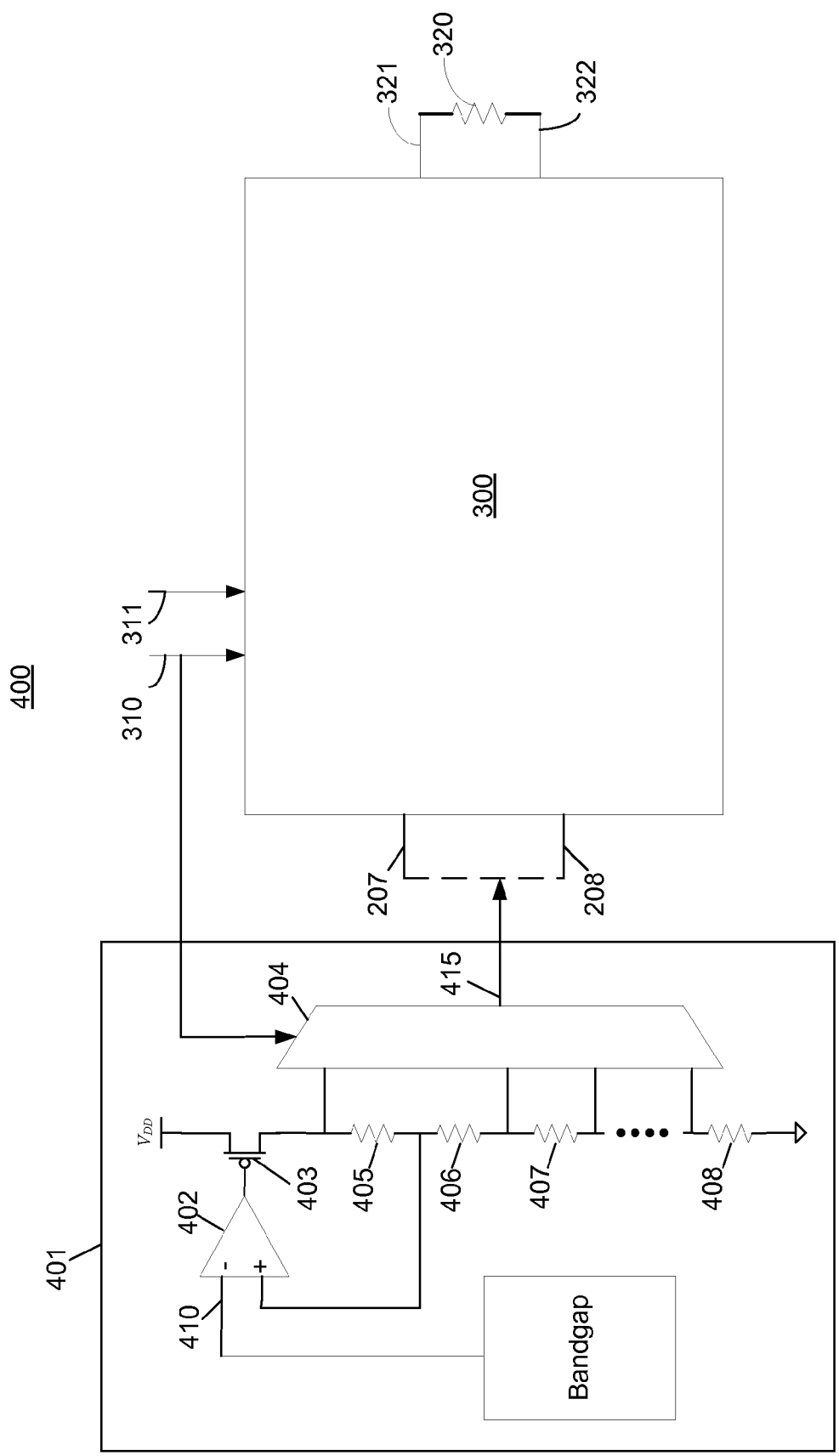
FIG. 4 illustrates a block diagram of an output circuit including the output circuit of FIG. 3 and a bias circuit according to an embodiment of the present invention.

FIG. 4 illustrates a block diagram of another output circuit including the circuit 300 and a bandgap circuit 401 according to an embodiment of the present invention. FIG. 4 shows the output circuit 300 is coupled to receive an output of circuit 401, where circuit 401 may provide the voltage bias needed to operate circuit 300. Circuit 401 may include a circuit generating a bandgap voltage coupled to signal 410, and selectively provide a bias voltage coupled to signal 415 based on a user-defined design. In the pictured embodiment, circuit 401 includes an OpAmp 402, a resistor network including resistors 405-408 configured as a voltage divider, and select circuit 404. For example, control signal 310 may configure the circuit 404 to selectively couple one of the voltages provided by resistors 405-408 to signal 415.

In an example of the present invention, signals 207 and 208 of circuit 400 may be coupled to receive the output of circuit 401, e.g., signal 415. As described above with reference to circuit 200, signals 207 and 208 are inputs to the current circuit 201 and the common-mode feedback circuit 202 respectively. The operation of circuit 400, for instance, may be insensitive to supply voltage and temperature variations since it is coupled to receive the bandgap voltage of circuit 401. Persons skilled in the art can appreciate that a bandgap voltage is insensitive to supply voltage and temperature variations.

Figure 5:
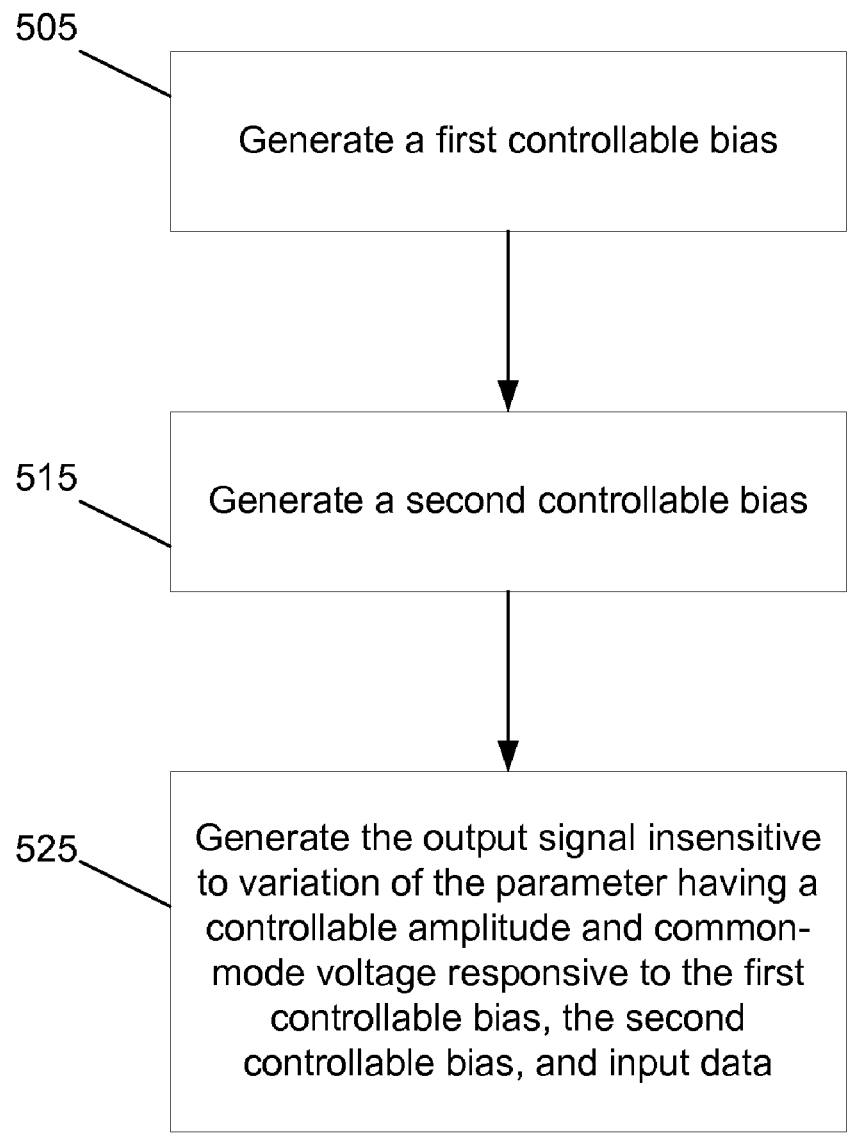
FIG. 5 illustrates a flow diagram of a method for providing a controllable output amplitude and common-mode voltage in an output interface according to an embodiment of the present invention.

FIG. 5 illustrates a flow diagram of a method of providing an output signal insensitive to a parameter. In an embodiment of the present invention, the output signal has an adjustable output amplitude and common-mode voltage and is insensitive to the variation of at least one parameter. The parameter may be, for example, one of supply voltage, temperature, or process. At step 505, a first controllable bias is generated. In an example, the current circuit 201 of FIG. 200 may be utilized to generate the first controllable bias of step 505. At step 515, a second controllable bias is generated. In an example, the common-mode feedback circuit 202 of FIG. 200 may be utilized to generate the second controllable bias of step 515.

At step 525, an output signal is generated that is insensitive to variation of the parameter and has a controllable amplitude and common-mode voltage. The output signal is responsive to the first controllable bias, the second controllable bias, and input data. The driver circuit 203 of FIG. 200 may be utilized to generate the output signal of step 525, for example. For instance, the generated output signal of step 525 is adapted to drive a user-defined impedance, such as termination impedances used to implement an LVDS protocol, or a CML (current mode logic) protocol. For example, the LVDS protocol may require the output signal to drive 100 Ohm differential termination impedance. In an example, the controllable amplitude aspect of the generated output signal may be realized by selectively coupling multiple driver modules (circuits) in parallel based on a user-defined amplitude. In another example, the controllable common-mode voltage aspect of the generated output signal may be realized by adjusting at least a first bandgap bias or a second bandgap bias.

The features of providing a controllable amplitude and controllable common-mode voltage may be implemented using the circuit illustrated in FIG. 2, for example. Other features of the method illustrated in FIG. 5 may be related to generating the output signal adapted to user-defined termination impedance. Multiple controllable impedances associated with the generating of the first controllable bias and the second controllable bias may be adjusted. The adjusting of the multiple impedances may minimize variation of the generating of output signal with respect to the user-defined termination impedance.

The method of FIG. 5 may provide an output signal insensitive to parameters such as supply voltage, process, and/or temperature. The feature of generating an output signal insensitive to the parameters is partially due to the utilization of the first bandgap bias and the second bandgap bias. In an embodiment of the present invention, the first bandgap bias and the second bandgap bias may have similar values. For example, the first and the second bandgap biases may be provided by a circuit similar to circuit 401 of FIG. 4.

Implementation of a module for generating an output signal insensitive to the variation of one or more of these parameters is described above with reference to circuit 200. Other methods of generating an output signal insensitive to the variation of parameters are well known to persons skilled in the art. For instance, elements with very low variation tolerance may be used to implement such modules. In general, elements having low variation tolerance are less impacted by variation in parameters; therefore, they provide signals with minimal variations.

Figures 6A, 6B:
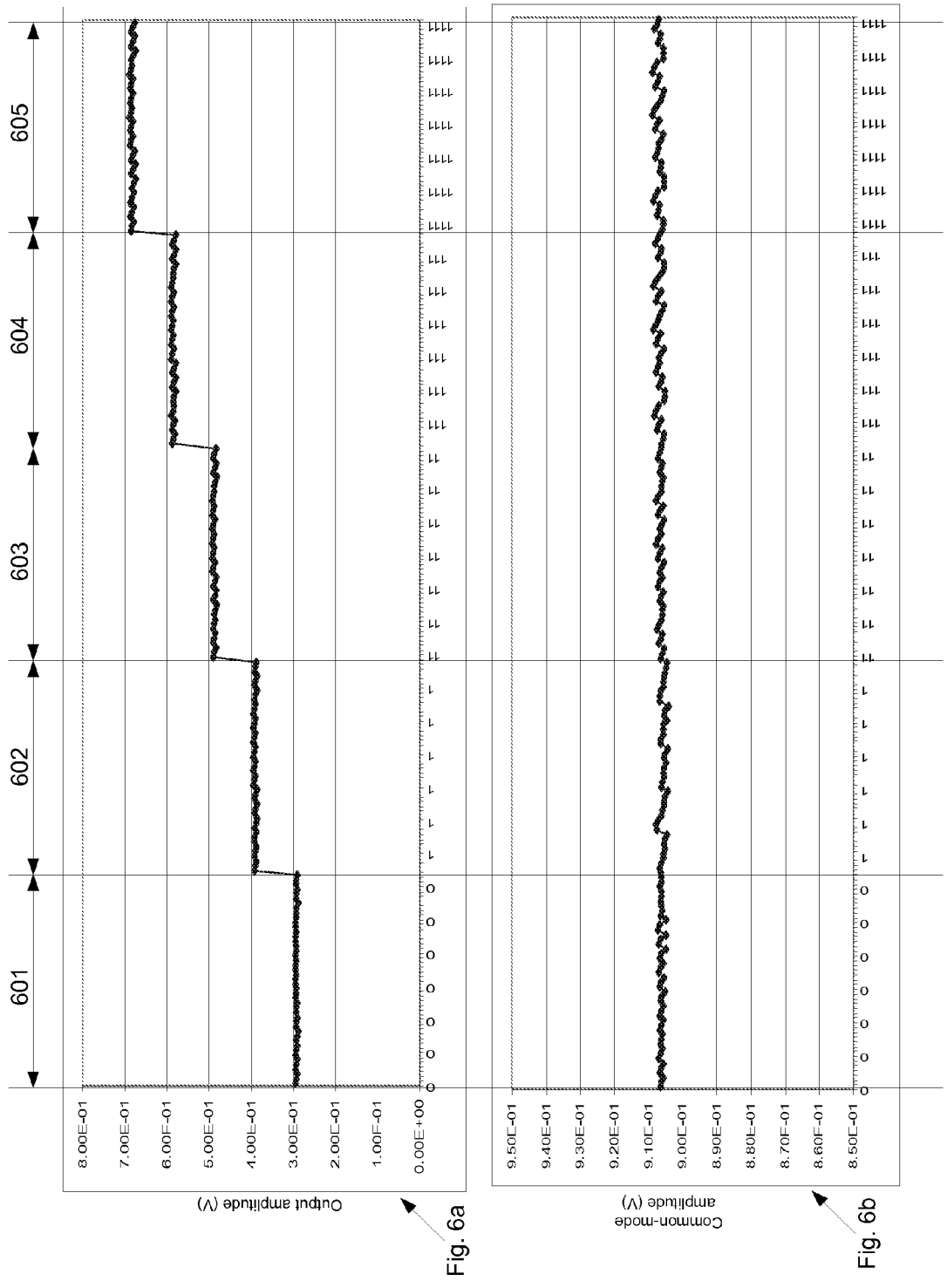
FIG. 6a graphically illustrates an output signal having controllable amplitude according to an embodiment of the present invention.
FIG. 6b graphically illustrates the common-mode voltage of the output signal of FIG. 6a according to an embodiment of the present invention.

FIG. 6a graphically illustrates an output signal having controllable amplitude according to an embodiment of the present invention, and FIG. 6b graphically illustrates the common-mode voltage of the output signal of FIG. 6a according to an embodiment of the present invention. For example, the two graphs shown in FIGS. 6a and 6b may represent the output of circuit 200, e.g., signal 235 or signal 236. FIG. 6b shows performance of the $V_{cm}$ (Y-axis) vs. supply voltage and temperature variations (X-axis). FIG. 6a shows performance of the output amplitude (Y-axis) vs. the same supply voltage and temperature variations (X-axis). For instance, an integrated circuit may specify the supply voltage and temperature operation range. The supply voltage range may be 2.25V-2.75V, for example, and a temperature range may be 0° C.-100° C. FIG. 6b shows the $V_{cm}$ having a value of approximately 900 mV and it is constant for over a range of output amplitudes (e.g., output amplitudes 601-605 of FIG. 6a), supply voltage, and temperature variations. The $V_{cm}$ may be configured to have other values, where the performance of the other $V_{cm}$ over supply voltage and temperature variation may be the same as the signal of FIG. 6b.

Sections 601-605 of FIG. 6a show the performance of an output signal having a range of amplitudes, where each section performance is measured over supply voltage and temperature variations. In an example, the X-axes of FIGS. 6a and 6B, which may include supply voltage, process, and temperature variations, may be identical. Section 601 illustrates a signal having amplitude of 300 mV, where the amplitude of range 601 is constant over supply voltage, process, and temperature variations (e.g., X-axis represented by 0). Amplitudes measured in sections 602-605, for example, are subjected to the same supply voltage, process, and temperature variations as section 601 (e.g., X-axis 1, 11, 111, 1111). The various sections (e.g., sections 601-605) may represent an output of an output circuit (e.g., circuit 300). For instance, the various amplitudes of sections 601-605 may represent selectively coupling circuits 302-304 of FIG. 3, where each of the sections may represent the coupling of one additional driver circuit of circuits 302-304.

Other variations of amplitude and $V_{cm}$ (not shown for simplicity) may be supported based on a user-defined design or implementation. FIGS. 6a and 6b may also represent output amplitude and $V_{cm}$ versus process variations. Those having skill in the relevant art of the invention will now perceive various modifications and additions that can be made as a result of the disclosure herein. For example, the above text describes the circuits and methods of the invention in the context of integrated circuits. However, the circuits of the invention can also be implemented in other electronic systems, for example, in printed circuit boards including discrete devices.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims. For example, the resistors 405-408 (of circuit 401 of FIG. 4) used as voltage dividers may be replaced with a plurality of reference voltages coupled to inputs of the select circuit 404. It will be clear to those of skill in the art that the invention can be practiced within this and other architectural variations.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. An output circuit, comprising:
   at least one driver circuit;
   a common-mode feedback circuit including a first replica circuit of the at least one driver circuit coupled to receive a first bias and provide an nbias coupled to the least one driver circuit; and
   a current circuit including a configurable resistor and a second replica circuit of the at least one driver circuit coupled to receive a second bias and provide a pbias coupled to the at least one driver circuit and the common-mode feedback circuits,
   wherein the first replica circuit and the second replica circuit each include at least one adjustable resistor.

2. The output circuit of claim 1, wherein a portion of the first replica circuit is similar to the second replica circuit.

3. The output circuit of claim 1, wherein the second replica circuit comprises:
   a PMOS transistor having a source coupled to a supply terminal and a gate coupled to receive the pbias;
   a pass gate having a first node coupled to a drain of the PMOS transistor; and
   the at least one adjustable resistor of the second replica circuit having a first node coupled to a second node of the pass gate, a second node coupled to receive a termination adjust control signal, wherein the termination adjust control signal configures the at least one adjustable resistor of the second replica circuit to have a value based on a termination impedance coupled to the at least one driver circuit.

4. The output circuit of claim 3, wherein the first replica circuit comprises:
a copy of the second replica circuit;
a second adjustable resistor having a first node coupled to a node of the copy of the second replica circuit and a second node coupled to the termination adjust control signal;
a first NMOS transistor having a drain coupled to a third node of the second resistor, and a gate coupled to the supply terminal; and
a second NMOS transistor having a drain coupled to a source of the first NMOS transistor, a gate coupled to the nbias, and a source coupled to a ground potential,
wherein the termination adjust control signal configures the second adjustable resistor to have a value based on the termination impedance coupled with the at least one driver circuit.

5. The output circuit of claim 1, wherein:
the at least one driver circuit comprises a driver circuit of a plurality of driver circuits, and
the plurality of driver circuits are selectively coupled with one another based on a user-defined output amplitude.

6. The output circuit of claim 5, wherein:
the plurality of driver circuits are identical to one another, and
each of the plurality of driver circuits is coupled to receive the nbias and the pbias.

7. The output circuit of claim 6, wherein the plurality of driver circuits provide an output having controllable amplitude and controllable common-mode voltage based on the first bias, the second bias, and the configurable resistor of the current circuit.

8. An integrated circuit, comprising:
a bandgap circuit; and
an output circuit, wherein the output circuit comprises:
at least one driver circuit coupled to receive input data and provide an output having a controllable amplitude and a controllable common-mode voltage;
a common-mode feedback circuit including a first replica circuit, the common-mode feedback circuit is coupled to receive a first bias of the bandgap circuit and provide nbias coupled to the at least one driver circuit; and
a current circuit including a configurable resistor and a second replica circuit, the current circuit being coupled to receive a second bias of the bandgap circuit and provide pbias coupled to the common-mode feedback circuit and the at least one driver circuit,
wherein the first replica circuit and the second replica circuit are copies of a portion of the at least one driver circuit.

9. The integrated circuit of claim 8, wherein the second replica circuit comprises:
a PMOS transistor having a source coupled to a supply terminal, and a gate coupled to receive the pbias;
a pass gate having a first node coupled to a drain of the PMOS transistor; and
a first adjustable resistor having a first node coupled to a second node of the pass gate, and a second node coupled to receive a termination adjust control signal.

10. The integrated circuit of claim 9, wherein the first replica circuit comprises:
a copy of the second replica circuit coupled to receive the termination adjust control signal;
a second adjustable resistor having a first node coupled to a node of the copy of the second replica circuit, and a second node coupled to receive the termination adjust signal;
a first NMOS transistor including a drain coupled to a third node of the second adjustable resistor, and a gate coupled to the supply terminal; and
a second NMOS transistor including a source coupled to a drain of the first NMOS transistor, a gate coupled to the nbias, and a drain coupled to a ground potential,
wherein the first and second NMOS transistors are a replica of NMOS transistors of the at least one driver circuit, and
wherein the first adjustable resistor, the second adjustable resistor, and the third adjustable resistor are fabricated to be identical.

11. The integrated circuit of claim 9, wherein the current circuit further comprises: an amplifier including a negative input coupled to receive the second bias of the bandgap circuit, a positive input coupled to a third node of the first adjustable resistor of the second replica circuit, and an output for providing the pbias, wherein:
the configurable resistor has a first node coupled to the positive input of the amplifier, a second node coupled to receive a current adjust control signal, and a third node coupled to a ground potential.

12. The integrated circuit of claim 9, wherein the common-mode feedback circuit further comprises:
an amplifier including a negative input coupled to receive the first bias of the bandgap circuit, a positive input coupled to the first replica circuit, and an output for providing the nbias.

13. The integrated circuit of claim 8, wherein the at least one driver circuit comprises a driver circuit of a plurality of driver circuits,
wherein the plurality of driver circuits are selectively coupled with one another based on a user-defined output amplitude.

14. The integrated circuit of claim 13, wherein:
the plurality of driver circuits are fabricated to be identical to one another; and
each of the plurality of driver circuits is coupled to receive the pbias and the nbias.

* * * * *